(12) United States Patent
Suzuki

(10) Patent No.: US 7,465,887 B2
(45) Date of Patent: Dec. 16, 2008

(54) WATERPROOF CASING HAVING RESPIRATION FILTER FOR CONTAINING ELECTRONIC COMPONENTS

(75) Inventor: Takamasa Suzuki, Obu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/882,134

(22) Filed: Jul. 31, 2007

(65) Prior Publication Data

US 2008/0074840 A1    Mar. 27, 2008

(30) Foreign Application Priority Data

Sep. 22, 2006    (JP)    ............... 2006-257902

(51) Int. Cl.
*H01R 13/46* (2006.01)
*H05K 5/00* (2006.01)

(52) U.S. Cl. ................. 174/520; 174/564; 454/184

(58) Field of Classification Search ............... 174/520, 174/17 VA, 559, 560, 564; 454/184
See application file for complete search history.

(56) References Cited

U.S. PATENT DOCUMENTS

| | | | |
|---|---|---|---|
| 5,248,848 A * | 9/1993 | Kornowski et al. | 174/535 |
| 6,600,653 B2 * | 7/2003 | Koike et al. | 361/704 |
| 7,151,674 B2 * | 12/2006 | Sasaki et al. | 361/752 |
| 7,189,918 B2 * | 3/2007 | Sakata | 174/17 VA |
| 7,214,874 B2 * | 5/2007 | Dangler et al. | 174/50 |
| 2006/0090918 A1 * | 5/2006 | Dangler et al. | 174/52.2 |
| 2008/0041624 A1 * | 2/2008 | Sasaki et al. | 174/520 |

FOREIGN PATENT DOCUMENTS

| | | |
|---|---|---|
| JP | A-2002-134939 | 5/2002 |
| JP | A-2004-356524 | 12/2004 |
| JP | A-2004-357462 | 12/2004 |
| JP | A-2005-150376 | 6/2005 |
| JP | A-2006-005162 | 1/2006 |
| JP | A-2006-041304 | 2/2006 |

* cited by examiner

*Primary Examiner*—Hung V Ngo
(74) *Attorney, Agent, or Firm*—Posz Law Group, PLC

(57) ABSTRACT

Electronic components such as a control unit for controlling operation of an internal combustion engine are contained in a waterproof casing. The casing is composed of a base and a cover, both connected to each other water-tightly. A respiration filter for establishing air communication between an inside and an outside of the casing is mounted on a mounting surface formed on an outer surface of the cover. The mounting surface is elevated from the outer surface of the cover, and has a plane facing a flange of the respiration filter. The plane is small relative to a height of a respiration hole of the respiration filter. Since the plane on the mounting surface facing the flange of the respiration filter is small relative to the height of the respiration hole, the respiration hole is prevented from being blocked with water staying on the mounting hole due to its surface tension.

6 Claims, 2 Drawing Sheets

WATERPROOF CASING HAVING RESPIRATION FILTER FOR CONTAINING ELECTRONIC COMPONENTS

CROSS-REFERENCE TO RELATED APPLICATION

This application is based upon and claims benefit of priority of Japanese Patent Application No. 2006-257902 filed on Sep. 22, 2006, the content of which is incorporated herein by reference.

BACKGROUND OF THE INVENTION

1. Field of the Invention

The present invention relates to a waterproof casing for containing electronic components, the casing including a respiration filter.

2. Description of Related Art

An example of a waterproof casing for containing electronic components therein is disclosed in JP-A-2002-134939. This casing is composed of a case body and a bottom cover for covering a bottom opening of the case body. A depressed portion is formed on an upper surface of the case body, and a tube for establishing communication between an inner space of the casing and an outside of the casing is disposed in the depressed portion. An upper opening of the tube is covered with a respiration filter. A drain groove is formed in the depressed portion to drain water entered into the depressed portion to a side opening of the casing.

However, there is a problem in the casing, that water closes respiration holes of the filter by its surface tension before it reaches the side opening of the casing when the casing takes a position where the drain groove becomes horizontal. This makes respiration of the casing difficult.

SUMMARY OF THE INVENTION

The present invention has been made in view of the above-mentioned problem, and an object of the present invention is to provide an improved waterproof casing for containing electronic components, in which respiration of the casing is well maintained.

The casing of the present invention is composed of a base and a cover, both being water-tightly connected to each other. Electronic components such as control unit for controlling operation of an internal combustion engine are contained in the casing. On an outer surface of the cover, a mounting plateau on which a respiration filter is mounted is formed. The mounting plateau includes a cylindrical portion rising from the outer surface and a mounting surface elevated from the outer surface by the cylindrical portion. The mounting plateau is formed by a press-work of a stamping operation.

The respiration filter that establishes air communication between an inside space of the casing and an outside of the casing while keeping the casing water-tight is mounted on the mounting surface of the mounting plateau. The respiration filter includes a flange facing the mounting surface with an O-ring interposed therebetween. The mounting surface is a little larger than a flange surface facing the mounting surface, and a height of a respiration hole of the respiration filter measured from the mounting surface is larger than a difference between the mounting surface and the flange surface facing the mounting surface.

Since an area on which water or liquid stays due to its surface tension is small relative to the height of the respiration hole, the respiration hole is prevented from being blocked with water. According to the present invention, air communication between the inside space of the casing and the outside is well established while keeping the waterproof function of the casing.

Other objects and features of the present invention will become more readily apparent from a better understanding of the preferred embodiment described below with reference to the following drawings.

DETAILED DESCRIPTION OF THE PREFERRED EMBODIMENT

Figure 1A:
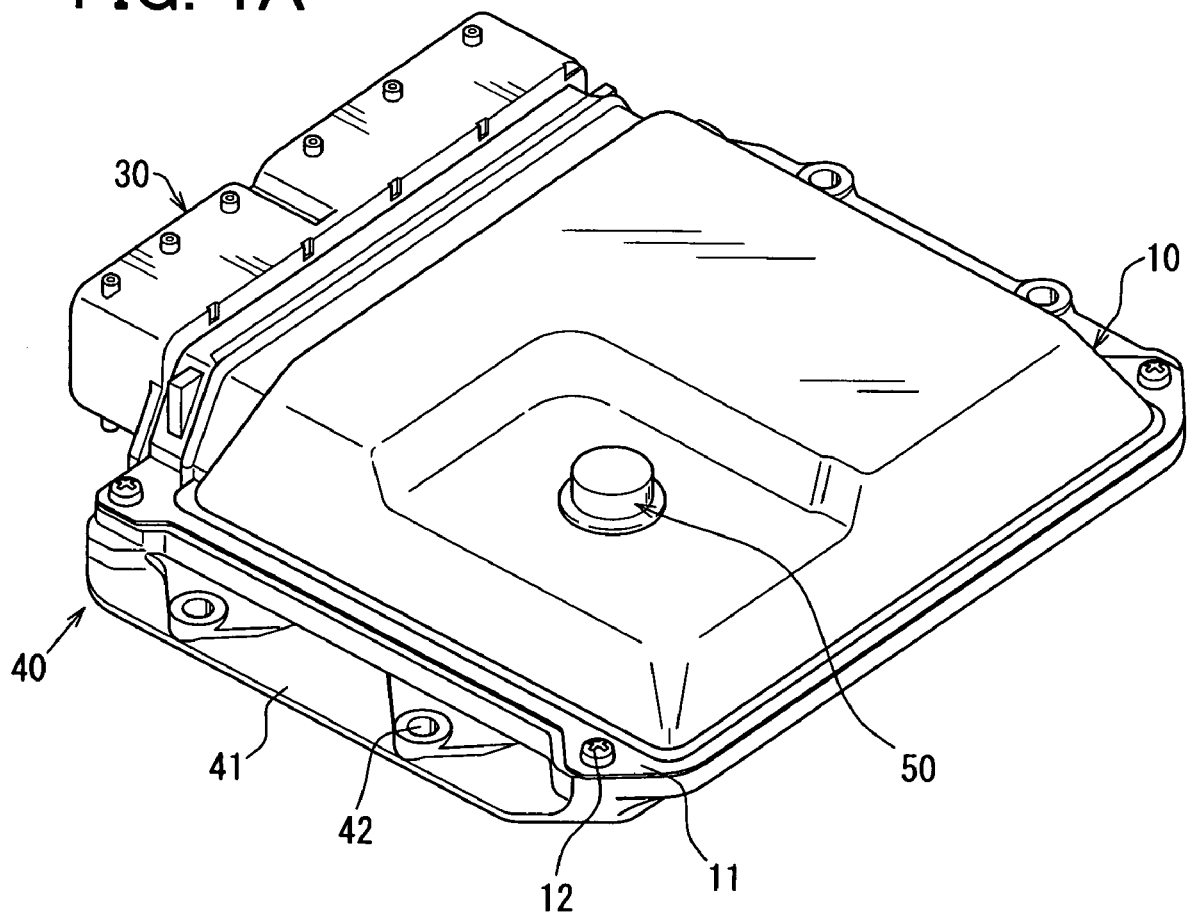
FIG. 1A is a perspective view showing a waterproof casing for containing electronic components therein according to the present invention.
Figure 1B:
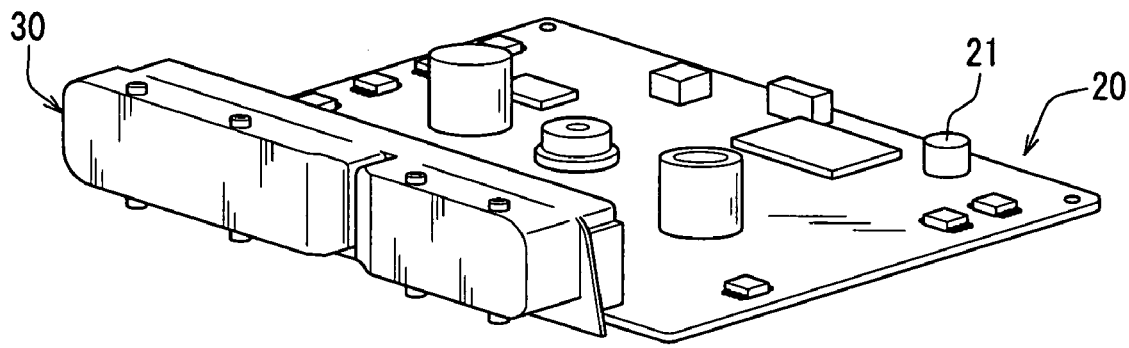
FIG. 1B is a perspective view showing a circuit board, on which electronic components and electrical connectors are mounted.

A preferred embodiment of the present invention will be described with reference to accompanying drawings. A waterproof casing shown in FIG. 1 is composed of a base 40 and a cover 10, both connected to each other. A circuit board 20 shown in FIG. 1B, on which various electronic components 21 and electrical connectors 30 are mounted, is contained in the waterproof casing. The waterproof casing is advantageously used as a casing for an electronic control unit for controlling operation of an internal combustion engine.

A respiration filter 50 is mounted on an outer surface of the cover 10 for establishing air communication between an inside space of the casing and an outside of the casing. The cover 10 and the base 40 are made of a metallic material such as aluminum or iron. The cover 10 has connecting portions 11 for connecting the cover 10 to the base 40 with screws 12. The base 40 has mounting fringes 41 for mounting the casing on a structure of an automotive vehicle, for example. Mounting holes 42 are formed on the mounting fringes 41, through which screws or bolts are inserted.

The circuit board 20 may be made of various materials, such as thermoplastic resin, thermosetting resin, ceramics, or a compound material such as fiber-reinforced glass. The casing is made strictly water-tight. Connecting portions between the cover 10 and the base 40, between the cover 10 and connectors 30, between the base 40 and the connectors 30 are water-tightly sealed.

Figure 2:
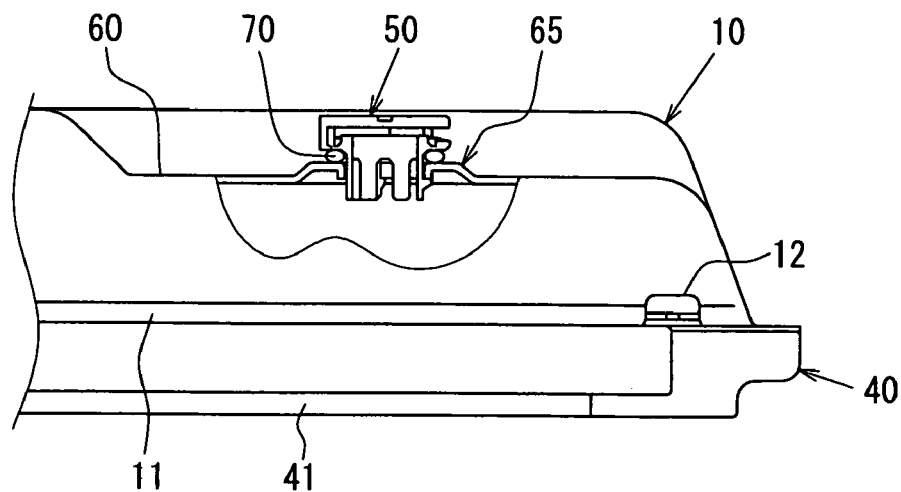
FIG. 2 is a side view showing the waterproof casing, partially opened to show a respiration filter mounted on the casing.

As shown in FIG. 2, the respiration filter 50 is mounted on an outer surface 60 of the cover 10. The respiration filter 50 establishes air communication between the inside and the outside of the waterproof casing while keeping the casing water-tight. Air pressures in the side and the outside of the casing are maintained equal by the respiration filter 50 even when ambient temperature considerably changes. If the air communication between the inside and the outside were not established, water-tightness would not be kept because of a pressure difference between the inside and the outside of the casing. Further, the casing would be deformed by the pressure difference. It is especially important to keep the inside pressure equal with the outside pressure when an atmospheric pressure sensor is installed on the circuit board 20, as in the case where the casing is used for containing the engine control unit.

Figure 3:
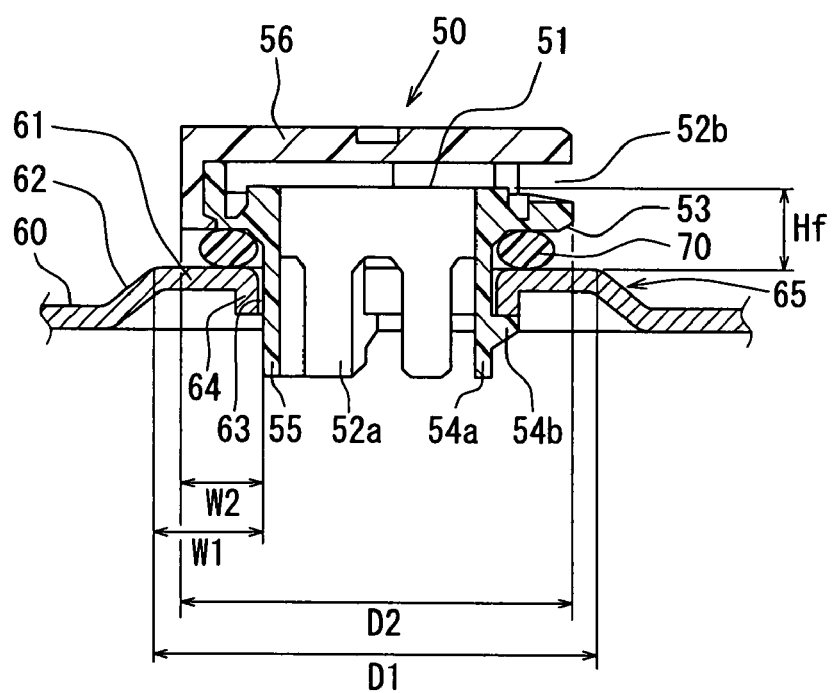
FIG. 3 is a cross-sectional view showing the respiration filter mounted on an outer surface of the casing.

As shown in FIG. 3, the respiration filter 50 is composed of a pipe 55 and a cap 56. The pipe 55 is a cylindrical member having air passage 52a therein. At one end of the pipe 55, plural leg portions 54a and claws 54b for engaging with a through-hole 63 are formed. At the other end of the pipe 55, a flange 53 facing a mounting surface 61 via an O-ring 70 is formed. A water-repellent film 51 is disposed to close upper opening of the air passage 52a. The water-repellent film 51 is made of a fiber material to which a water-repellent property is given. The water-repellent film 51 allows air to pass through while preventing water from passing through. The cap 56 closes an upper opening of the pipe 55, with the water-repellent film 51 interposed therebetween. The cap 56 forms a respiration hole 52b in cooperation with the flange 53 of the pipe 55. The respiration hole 52b communicates with the air passage 52a through the water-repellent film 51.

As shown in FIG. 3, a mounting plateau 65 for mounting the respiration filter 50 thereon is formed on the outer surface 60 of the cover 10. The mounting plateau 65 is composed of a mounting surface 61 elevated toward the outside of the cover 10 by a cylindrical portion 62 rising from the outer surface 60. The mounting surface 61 is substantially in parallel to the outer surface 60 of the cover 10. An inner periphery 64 of a hole formed through the mounting surface 61 is bent inwardly, thereby forming a through-hole 63 to which the pipe 55 is inserted. The mounting plateau 65 is formed on the outer surface 60 of the cover 10 by a press-work or a stamping operation.

A size of the mounting surface 61 facing the flange 53 of the pipe 55 is made larger than a size of the flange 53 facing the mounting surface 61. That is, as shown in FIG. 3, a width W1 is larger than a width W2. When an O-ring 70 is compressed between the mounting surface 61 and the flange 53, the width W1 is made to sufficiently cover an outer periphery of the O-ring 70 to thereby firmly keep the O-ring 70 on the mounting surface 61. Preferably, the mounting surface 61 is made in a circular shape. In this case, a diameter D1 of the mounting surface 61 is made larger than a diameter D2 of the flange 53. Further, a height Hf from the mounting surface 61 to the respiration hole 52b is made larger than a surface area difference (W1−W2) or one half of the diameter difference (D1−D2). In the case where the mounting surface 61 is made in a round shape, the above dimensional relation is expressed by a formula:

$$\tfrac{1}{2}(D1-D2)=(W1-W2)<Hf.$$

When the mounting surface 61 becomes wet with water (or other liquid), an amount of the water staying on the mounting surface 61 cannot be large because the surface area on which the water stays is not large. Further, a possibility that the respiration hole 52b is blocked with the water due to its surface tension is very low because the height Hf is large relative to the surface area (W1−W2). In addition, since the width W1 is made a little larger than the width W2, the respiration filter 50 is easily positioned on the mounting surface 61, and the O-ring 70 can be securely kept on the mounting surface 61.

It is preferable to form the cylindrical portion 62 to rise from the outer surface 60 with a slope, so that water on the mounting surface 61 easily flows toward the outer surface 60. The mounting surface 61 is elevated from the outer surface 60 by such a height that the water staying on the outer surface due to its surface tension does not reach the respiration hole 52b. Thus, the respiration hole 52b is prevented from being blocked with water.

The respiration filter 50 is mounted on the mounting surface 61 with the O-ring interposed therebetween. The pipe 55 of the respiration filter 50 is inserted into the through-hole 63 formed in the mounting surface 61, claws 54b of the pipe 55 engage with an axial end of the through-hole 63. The O-ring 70 disposed between the mounting surface 61 and the flange 53 is compressed so that the respiration filter 50 is watertightly connected to the cover 10. Thus, the respiration filter 50 is mounted on the mounting surface 61.

Advantages of the present invention will be summarized below. The respiration filter 50 is connected to the cover 10 of the casing to provide respiration function to the casing while keeping water-tightness of the casing. Since the surface area of the mounting surface 61, on which water stays due to its surface tension, is made small relative to the height Hf of the respiration hole 52b measured from the mounting surface 61, the respiration hole 52b is hardly blocked with water. Since the width W1 is made larger than the width W2, the respiration filter 50 is easily positioned on the mounting surface 61. The casing of the present invention is advantageously used as a container for the electronic control unit (ECU) of an internal combustion. Although the casing of the ECU often becomes wet with water, the respiration hole 52b is not easily blocked with water.

The present invention is not limited to the embodiment described above, but it may be variously modified. For example, though only one respiration filter 50 is mounted on the casing in the embodiment described above, two or more respiration filters may be mounted. While the present invention has been shown and described with reference to the foregoing preferred embodiment, it will be apparent to those skilled in the art that changes in form and detail may be made therein without departing from the scope of the invention as defined in the appended claims.

What is claimed is:

1. A waterproof casing for containing electronic components therein, comprising:

a respiration filter having a respiration hole mounted on the casing for establishing air communication between an inside space of the casing and an outside of the casing; and a mounting plateau, formed on an outer surface of the casing, composed of a cylindrical portion rising from the outer surface of the casing toward the outside of the casing and a mounting surface connected to the cylindrical portion, the mounting surface being in parallel to the outer surface and elevated therefrom by the cylindrical portion, the mounting surface having a through-hole to which the respiration filter is water-tightly connected, wherein:

a plane area of the mounting surface is larger than a plane area of a flange of the respiration filter facing the mounting surface; and a difference between the plane areas is smaller than a height of the respiration hole from the mounting surface.

2. The waterproof casing as in claim 1, wherein:

the respiration filter is mounted on the mounting surface via a waterproof O-ring; and the plane area of the mounting surface is larger than an area occupied by the O-ring when it is compressed.

3. The waterproof casing as in claim 1, wherein the mounting plateau is formed on the outer surface of the casing by a press-work.

4. The waterproof casing as in claim 1, wherein the cylindrical portion of the mounting plateau is slanted relative to a direction perpendicular to the outer surface of the casing.

5. The waterproof casing as in claim 1, wherein:

the mounting surface of the mounting plateau and the flange of the respiration filter are formed in a round shape;

a diameter of the mounting surface is larger than a diameter of the flange of the respiration filter; and one half of a difference between the diameters of the mounting surface and the flange is smaller than a height of the respiration hole from the mounting surface.

6. An electronic control unit comprising:

electronic components mounted on a circuit board; and a waterproof casing for containing the electronic components, the water proof casing including:

a respiration filter having a respiration hole mounted on the casing for establishing air communication between an inside space of the casing and an outside of the casing; and a mounting plateau, formed on an outer surface of the casing, composed of a cylindrical portion rising from the outer surface of the casing toward the outside of the casing and a mounting surface connected to the cylindrical portion, the mounting surface being in parallel to the outer surface and elevated therefrom by the cylindrical portion, the mounting surface having a through-hole to which the respiration filter is water-tightly connected, wherein:

a plane area of the mounting surface is larger than a plane area of a flange of the respiration filter facing the mounting surface; and a difference between the plane areas is smaller than a height of the respiration hole from the mounting surface.

* * * * *